(12) United States Patent
O'Reilly et al.

(10) Patent No.: US 7,763,872 B2
(45) Date of Patent: Jul. 27, 2010

(54) HIGH POWER EUV LAMP SYSTEM

(75) Inventors: Fergal O'Reilly, Dublin (IE); Patrick Hayden, Carlow (IE); Gerard O'Sullivan, Blackrock (IE); Padraig Dunne, Dublin (IE)

(73) Assignee: University College Dublin, National University of Ireland, Dublin, Dublin (IE)

( * ) Notice: Subject to any disclaimer, the term of this patent is extended or adjusted under 35 U.S.C. 154(b) by 351 days.

(21) Appl. No.: 12/083,361

(22) PCT Filed: Oct. 23, 2006

(86) PCT No.: PCT/EP2006/010187

§ 371 (c)(1),
(2), (4) Date: Apr. 10, 2008

(87) PCT Pub. No.: WO2007/051537

PCT Pub. Date: May 10, 2007

(65) Prior Publication Data

US 2009/0153975 A1 Jun. 18, 2009

(30) Foreign Application Priority Data

Nov. 2, 2005 (IE) .............................. S2005/0730

(51) Int. Cl.
*G01J 3/10* (2006.01)

(52) U.S. Cl. ................. 250/504 R; 250/492.1; 250/492.2; 250/492.21; 250/492.3; 250/493.1; 250/503.1; 359/227; 359/228; 359/234; 359/235; 359/350; 359/358

(58) Field of Classification Search .............. 250/492.1, 250/492.2, 492.21, 492.3, 493.1, 503.1, 504 R; 359/227, 228, 234, 235, 350, 358

See application file for complete search history.

(56) References Cited

U.S. PATENT DOCUMENTS

2005/0280790 A1* 12/2005 Emoto .................. 355/53

* cited by examiner

*Primary Examiner*—Jack I Berman
*Assistant Examiner*—Hanway Chang
(74) *Attorney, Agent, or Firm*—The Nath Law Group; Jerald L. Meyer; Jiaxiao Zhang (57) ABSTRACT

A system for providing extreme ultraviolet (EUV) radiation comprises a laser source arranged to produce a laser beam having a focus; and a carrier movable relative to the laser source for carrying a surface material, the surface material when carried by the carrier providing a renewable target edge. The focussed beam is arranged to impinge on the target edge to produce an EUV radiation emitting plasma. The system is cooperable with a mirror for harnessing the EUV radiation by reflecting EUV radiation impinging thereon. The mirror comprises a substantially aspheric surface and means for supplying a reflecting liquid to at least partially coat the aspheric surface, the mirror being rotatable to centrifugally confine the liquid to the aspheric surface.

39 Claims, 8 Drawing Sheets

HIGH POWER EUV LAMP SYSTEM

The present invention relates to a system for providing extreme ultraviolet (EUV) radiation. Furthermore, the present invention relates to a mirror for harnessing EUV radiation.

Radiation in the range 1 nm to 100 nm is typically produced using high-energy plasma discharges. These may be produced in an electrical discharge or in laser plasma, where a high power laser is focused onto a target material.

When a high power laser pulse is incident on a material, for example, tin, highly ionised plasma is produced. The light output of this plasma depends on the laser wavelength, energy and pulse length, the target material and the target geometry. (The optical (including EUV) emission is typically not isotropic from laser plasma.)

If a laser pulse impinges a flat surface, the plasma produced rises roughly normal to the surface, leaving a crater in the material. Material in the vicinity of the laser plasma is also boiled off the surface by the expanding plasma plume and optical radiation.

The crater being blown is of the order of 1 μm to 100 μm in depth per pulse, depending on the target material and laser power. As the pulse progresses, the walls of the crater obscure the EUV output from the base of the plasma.

Similarly, as the laser plasma expands and the optical emission boils material off the surrounding target, the vaporised material rises to further obscure the EUV emission from the plasma.

EP 1150169 disclose Xenon gas jets, which are typically used as laser plasma targets because Xe is a noble gas and does not form coatings on the surface of optical elements in the light source. However Xenon jets have theoretical EUV conversion efficiencies about 3 times lower than tin at the required wavelength. Thus, a laser with 3 times the power would be required to achieve the same EUV output.

U.S. Pat. No. 5,459,771 discloses the use of liquid droplets as laser plasma targets. These include doped water droplets and liquid metal targets. The water droplets are mixtures of materials that are designed to produce less debris than pure metals. However liquid droplets are difficult to control, and produce a lower EUV output. Also, reactive elements in the liquid cause contamination of source optics.

US2002094063 discloses solid tapes as laser plasma targets, which may be comprised of any solid material with a very broad range of spectral outputs possible. However they produce a low conversion efficiency and difficulty of supplying 10 m/s of tape continuously for thousands of hours of operation.

DE19743311 discloses the use of a liquid film, which is another renewable target type that is simpler than the droplet method.

US2004264512 discloses a method of pre-pulsing, where a plasma is formed with a low intensity laser pulse above a target. This plasma is then used as a target for a second higher energy laser pulse and the resulting second plasma is optically thin, since the first plasma has lower than solid density. This increases the EUV output by reducing EUV self-absorption in the laser plasma. However this method still requires that the target be delivered in a way which will minimise subsequent loss.

WO2004086467 discloses the use of target mixtures. Currently these include polymers with metal, metal and water and metal doped ceramics. However, most of these produce reactive debris and the target is not recoverable after it has been shot once.

Electrical Pulsed Discharges are also potential EUV sources. However, these suffer from source size and collection angle difficulties and they are not easily scaled. Recent advances suggest that they may be able to compete with laser plasmas in terms of output EUV efficiency, but collection and use of this light will still pose problems.

EUV radiation sources will be required for the next generation lithography of semiconductor circuits. Intense research is ongoing to produce an EUV radiation source (13.5 nm) with an output power of greater than 115 watts which can be used in high volume manufacturing. By providing a system with increased conversion efficiency (the output of EUV light energy per unit of input energy), this power level will be achieved cheaper and sooner.

It is therefore an object of the present invention to address the problem of increasing the output of EUV light sources.

Although this system produces plasmas with the required EUV radiation, it also produces high-energy ions and lower energy debris, which typically are not required outputs from the system.

Thus, a further problem exists in trying to harvest as much of the light as possible from the laser plasma. This is due to the fact that no solid materials transmit radiation in the 1 nm to 100 nm EUV radiation region and therefore no solid separation window can be produced to keep the end use of the EUV radiation from being contaminated by the debris from the plasma source.

Some known systems for producing EUV use Mo/Si multilayer mirrors at normal incidence or Ru based single layer mirrors at a grazing angle, to try to harvest this radiation. These mirrors are produced with nanometer precision and are required to be almost atomically flat, making them extremely sensitive to debris from the plasma and erosion by high energy ions. In addition, current Mo/Si multilayers reflect in only a very specific window around 13.5 nm.

Attempts are underway to reduce the problems associated with the debris emission from plasmas. These include using inert gas targets, porous material windows including capillary arrays, electric and magnetic fields and gas curtains. They all reduce the level of debris arriving at the delicate optics, but the collector optic always suffers damage.

In the present case, in order to use the EUV radiation from the plasma source, optical elements are applied to the radiation to collect as much of the plasma produced EUV as possible. The collection optics are placed close to the EUV producing plasma and cover a large solid angle. It is nonetheless extremely difficult to protect the collecting optics from the plasma produced debris and high-energy ions.

Preferably, the speed of rotation of said mirror is chosen to balance centrifugal and surface wetting forces to ensure a uniform coating of said liquid.

The mirror of the present invention provides sufficient reflection efficiency, although not as high as the solid Mo/Si or Ru mirrors. The liquid reflection surface, however, has advantages that will mean that it can outperform the other mirrors in terms of lifetime, cost and simplicity. These are key factors for any EUV radiation source in a high-volume manufacturing environment.

The mirrors of the present invention can have a very broad reflectivity range, as different liquids can be used as well as different combinations of surfaces of revolution including elliptical, hyperbolic, parabolic and circular.

Embodiments of the invention will now be described, by way of example, with reference to the accompanying drawings, in which:

FIG. 7 is a more detailed view of the mirror system of FIG. 6; and.

Figure 1:
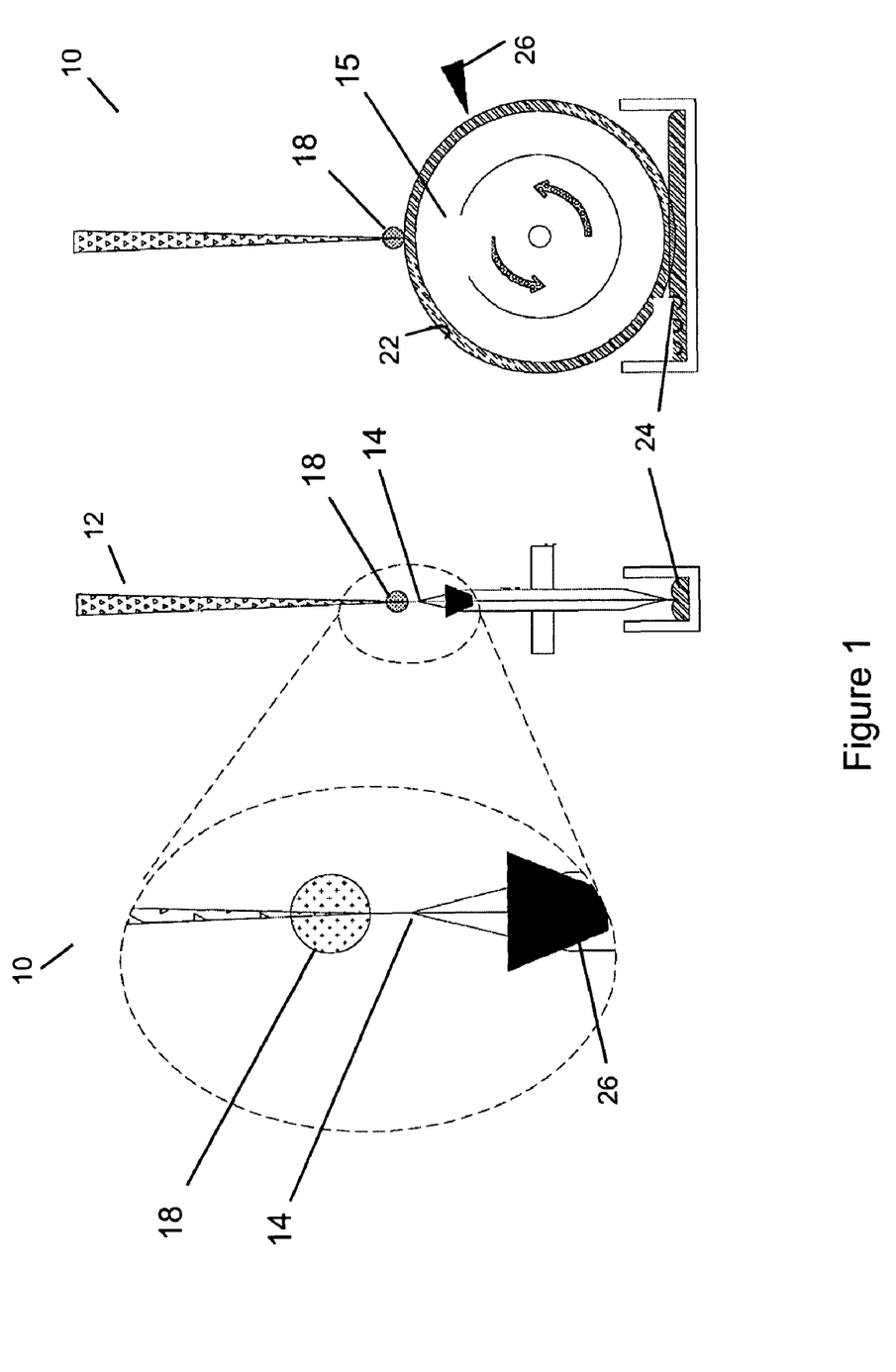
FIG. 1 is a target delivery system for an EUV system according to the preferred embodiment of the present invention

Referring now to FIG. 1 of the accompanying drawings there is illustrated, a target delivery system generally indicated as 10. The target delivery system 10 comprises a laser source (not shown) producing a beam 12 arranged to focus on a region of a sharp target edge 14 of a surface material to produce a highly ionised plasma 18, which in turn produces EUV emissions.

In the preferred embodiment, the laser has a wavelength of 1064 nm and is pulsed with a pulse length preferably of approximately 15 nanoseconds and preferably with a pulse power density of approximately $1.6 \times 10^{11}$ Watts/cm$^2$.

With this type of laser pulse focused onto a spot of 50 μm by 50 μm on a flat surface, as in the prior art, a crater would be formed in the target material of approximately 100 μm by 100 μm by 10 μm deep, depending on the target material properties.

By focusing the laser beam 12 to impinge on the sharp edge target 14, the EUV emissions produced are not obscured by crater formation in the target 14 or by material evaporated from the surface as there is little or no material in which crater walls can be formed or which can be boiled off, on at least one side of the plasma 18. Research shows that the emission from a target edge 14 is up to three times higher than emission from a flat surface target.

In the preferred embodiment, as illustrated in FIG. 1, the surface material is applied as a liquid metal coating to a blade 22. In the preferred embodiment, the surface of the blade 22 is formed of molybdenum. The blade 22 is formed on a carrier comprising a substantially wheel shaped roller 15 which is continuously rotated through a bath 24 containing the liquid metal, thereby coating the blade 22 with the liquid metal.

In the preferred embodiment, the liquid metal is pure Tin (Sn). However it will be appreciated that the liquid metal may be one of many alloys preferably of tin such as eutectic SnGa (Tin Gallium).

As the blade 22 is on a roller 15 rotating at between approximately 100 rpm and 300 rpm, the liquid will preferentially redistribute itself to conform to the edge of the blade 22. The thickness of the metal coating on the blade 22 is preferably of the order of a few microns.

In the preferred embodiment, the roller 15 has a diameter of between about 30 cm and 1 m and preferably about 30 cm and a thickness of about 1 cm. However it will be appreciated that the diameter of the wheel may be of any suitable value.

In the preferred embodiment, the blade 22 has a base thickness of between approximately 100 μm to 1 cm and preferably about 100 μm and a height of about 1 cm.

In the preferred embodiment, the plasma produced has a diameter of approximately 100 μm, which emits EUV radiation largely isotropically. The height of the blade 22 is chosen so as to ensure that the optical path of the EUV radiation emanating from the plasma is not obscured up to an emission angle 60 degrees from the optic axis so that as much of the EUV radiation can be harnessed as possible, as will be described in more detail later.

In the preferred embodiment, a doctor blade 26 is disposed several centimetres before the laser focus region to regulate the coating thickness at the edge of the blade 22.

Figure 2A:
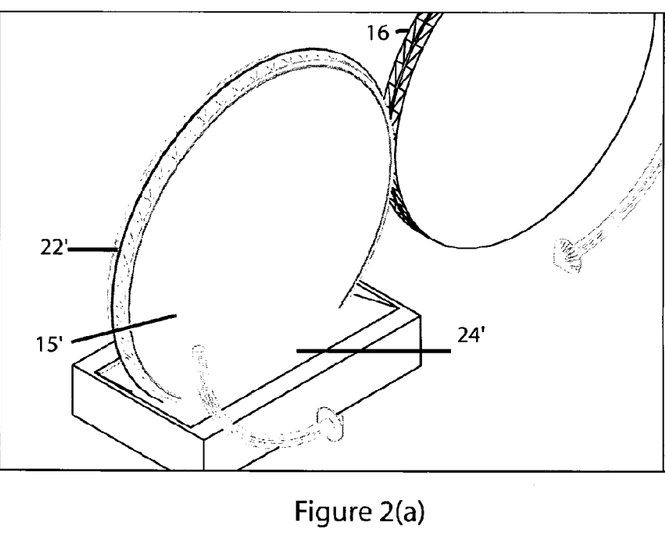
FIGS. 2(a) and 2(b) show a target delivery system according to a second embodiment of the present invention.
Figure 2B:
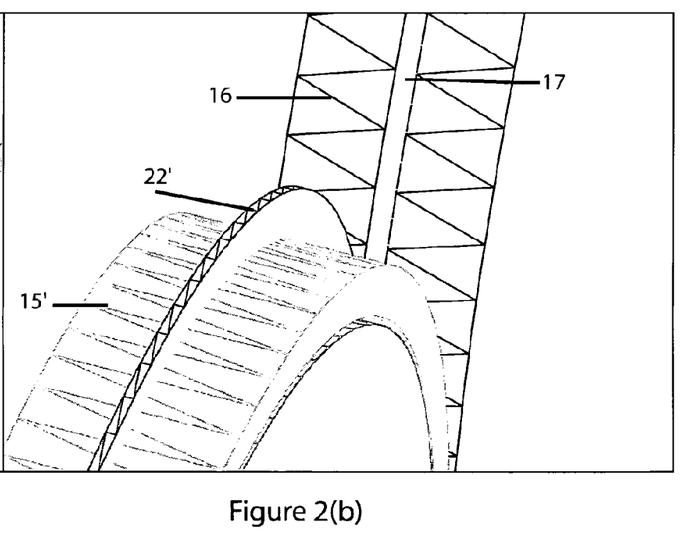

In an alternative embodiment, the target edge can be pressed into a soft material or molten material as it hardens using a suitably shaped roller 16 or mould press, as illustrated in FIGS. 2(a) and 2(b). The roller 16 comprises a groove 17. As the roller 15' is rotated through the liquid metal bath 24', its circumference is coated with the liquid. The roller 16, rotating in the opposite direction, is pressed into the roller 15' and the groove 17 facilitates the formation of a blade 22' along the circumference of the roller 15 as the liquid metal hardens, thereby forming the sharp edge target.

In variations of the first embodiment, the generally triangular section blade 22 is replaced with a square profile blade (not shown) and the sharp target edge comprises one or both edges of the blade. Nonetheless, it will be appreciated that in this implementation, more of the EUV radiation is absorbed by the body of the blade than in the case of the blade 22. Thus, proportionally less EUV radiation is available for collection by for example the mirror system described below.

In a further aspect of the invention, there is provided a liquid mirror designed to bring to focus EUV radiation, preferably in the range 1 nm to 100 nm from the high temperature plasma 18.

Materials reflect EUV radiation impinging on them at a shallow grazing incident angle. If the angle between the incident beam and the reflector is above a certain value, which depends on the material reflecting and the wavelength being reflected, then the reflected EUV intensity drops to near zero. In order to collect as much of the radiation emanating from the plasma source 18 as possible, the highest possible solid angle should be subtended by a collector with respect to the plasma source.

Figure 3:
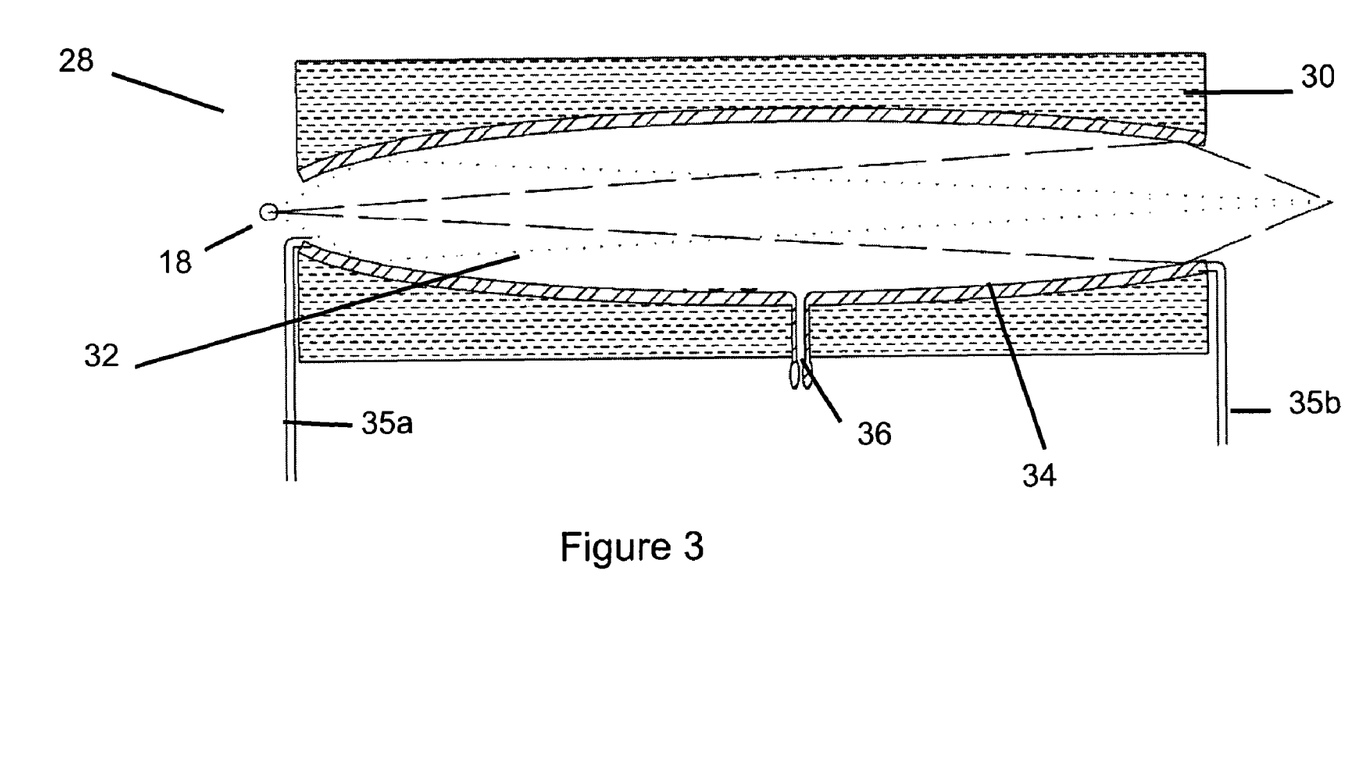
FIG. 3 is a mirror system according to a further aspect of the present invention cooperable with the target delivery system of FIG. 1.

Referring now to FIG. 3, there is illustrated a mirror 28 comprising a rotating metal cylinder 30, from which a substantially ellipsoidal surface 32 has been machined. The ellipsoidal surface 32 acts to focus rays 31 from one focus of the ellipsoid to the other, as depicted in FIG. 3. In particular, the ellipsoidal surface 32 acts as a focusing system for EUV photons from a high power plasma discharge or laser plasma source, typically 10 kW to 30 kW.

In the preferred embodiment, the mirror 28 is manufactured from a material that: will not be attacked or dissolved by liquid gold or tin; is easily polished and prepared for wetting with mirror liquid; and is resistant to corrosion in the temperature range of interest (up to 550° C.), such as Molybdenum.

The mirror is produced by coating the ellipsoidal surface 32 with an appropriate reflecting liquid 34, and in particular, low melting point liquid metals, alloys or low vapour pressure vacuum oils. Preferably, the liquid is chosen so that it wets the surface 32 well as is discussed in more detail later on. Preferably the surface is prepared so that it is wet well by the liquid chosen.

The ellipsoidal shape 32 is preferable for two reasons. Firstly, it is desirable to keep the mirror 28 as far from the plasma 18 as possible without having a lens too large to rotate.

The focal length of the mirror is chosen principally for reasons of thermal management. The optical properties of the ellipsoid shape remain reasonably constant as the focal length (distance between the object focus and image focus) is scaled up or down, providing the eccentricity remains constant. Preferably, the focal length of the ellipsoid 32 will begin the range 600 mm to 1800 mm and in the preferred embodiment, a focal length value, F=1200 mm, is preferred as a compromise between increasing mirror mass as the focal length is increased, with its associated increasing materials handling the complexity and costs, and increased distance between the mirror edge and the emitting plasma, which could be radiating more than 30 kW of heat into the surrounding region.

Secondly, the eccentricity is chosen so as to achieve the maximum capture of EUV/Soft x-ray radiation from the plasma source, given that the plasma source 18 has finite dimensions between 100 µm and 1000 µm in diameter. Preferably, the eccentricity of the ellipsoid 32 will be in the range 0.99809 to 0.98892. In the preferred embodiment, the eccentricity of the ellipsoid is around 0.99352.

The reduction of reflectivity of the liquid 34 to approximately zero at a grazing angle greater than 40° and the reduction in intensity of most sources as a function of distance from the centre of the source means that very little is gained by having a numerical aperture greater than 0.81. This defines the start position of a particular lens relative to the source focal point. In the preferred embodiment, the source 18 is located 7.8 mm in the direction of longitudinal axes from the mirror edge and the opening of the mirror is 26.8 mm in diameter.

In the preferred embodiment, a eutectic alloy, such as Au80Sn20, is used as the mirror liquid 34. The melting point of this eutectic is 280° C. So, for a 986 mm mirror, the volume of eutectic required for a 100 micron coating is approximately 40 cm3, and the mass of eutectic required for a 100 µm coating is approximately 0.625 kg. Such a mirror liquid 34 will produce a mean reflectivity of approximately 40% over the grazing angles of interest, in the range of around 6° to 35°.

For example, using the AuSn eutectic as the mirror liquid 34, it is possible to collect up to 13% of 13.5 nm radiation emitted into $2\pi$ steradians by a source with a diameter of 1000 µm and to bring it to a focus of diameter 4 mm with an image solid angle of 0.19 steradians and an etendue of 2.4 $mm^2sr$.

Furthermore, from a source with a diameter of 100 µm, it is possible to collect 21% of the 13.5 nm light emitted into $2\pi$ steradians and bring it to a focus of diameter 4 mm with an image solid angle of 0.19 steradians and an etendue of 2.4 $mm^2sr$.

Another example of a reflecting liquid is Field's metal (32.5% Bi, 51% In, 16.5% Sn, MP 62° C.) which has a reflectivity only marginally less than the AuSn eutectic, but has a much lower melting point and is much cheaper.

For more simpler systems another eutectic alloy with lower EUV reflectivity, Galinstan (68.5% Ga, 21.5% In, 10% Sn) which is liquid above −20° C., may be used. This may be particularly useful in hybrid systems described in relation to FIG. 8 below.

Referring now to FIG. 3, the mirror liquid 34 is injected into the mirror 28 through first and second hollow tubes 35a and 35b, which are static, separate from the mirror body, and connected to a metal pumping system (not shown). The outer diameter of the tubes 35a, and 35b, is preferably around 0.5 mm. Preferably, the tubes are made of a material, which will not be corroded by the mirror liquid, such as molybdenum. Preferably, the material is capable of withstanding the temperature in proximity to the plasma.

However it will be appreciated that the mirror liquid 34 may be introduced into the mirror 28 by any suitable mechanism. For example, in an alternative embodiment (not shown), the mirror liquid 34 is introduced to the mirror 28 through small bored holes located around 1 cm along the cylinder length from the plasma end of the mirror 28.

In the preferred embodiment, as illustrated in FIG. 3, excess liquid is released through a hole 36 at the widest part of the mirror interior, which will form a sink once every rotation.

Figure 4:
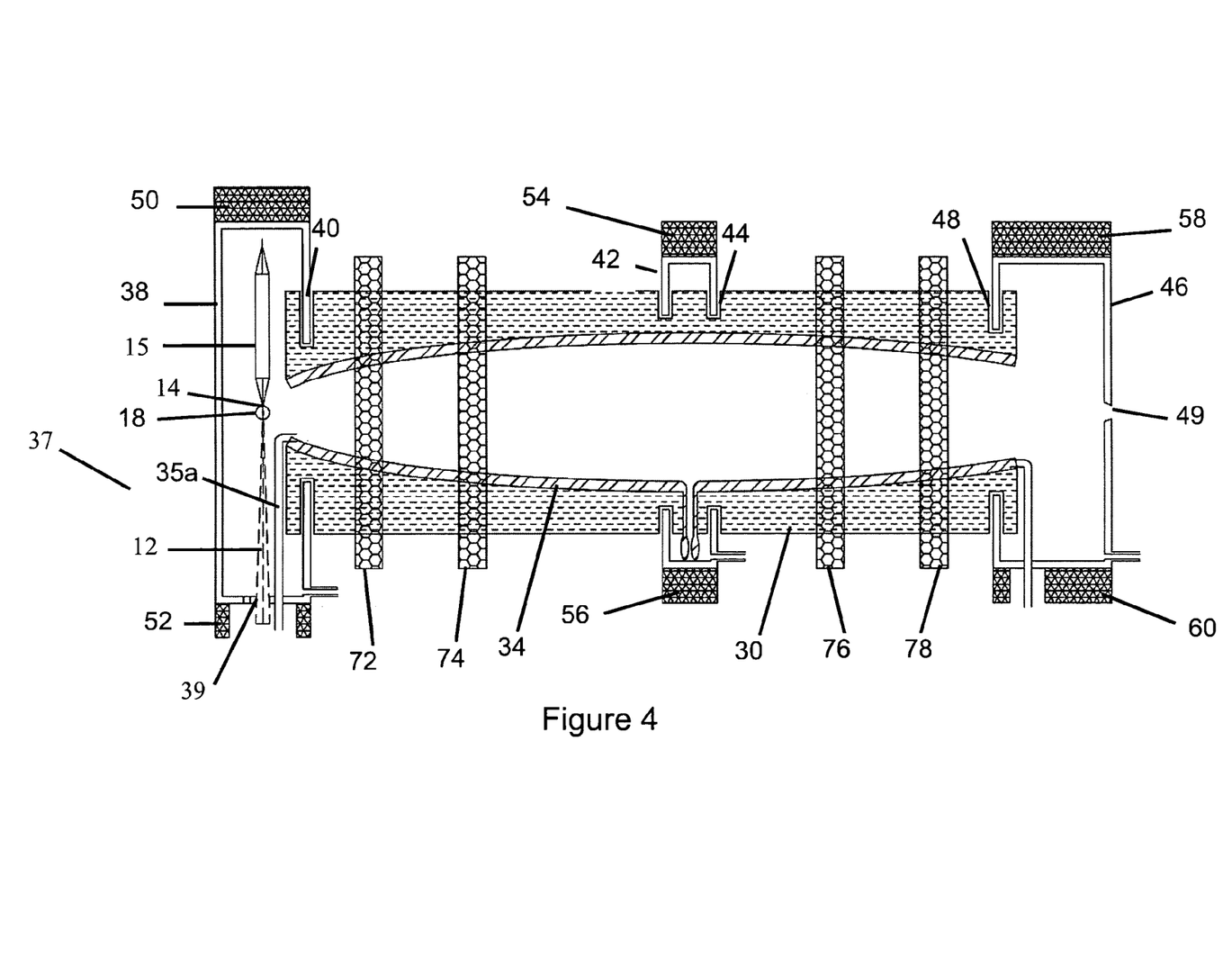
FIG. 4 is a more detailed view of the mirror system of FIG. 3.

Referring to FIG. 4, there is illustrated a system 37, comprising the target delivery system 10 and the mirror 28, according to the preferred embodiments of the present invention. In the preferred embodiment, the mirror 28 is rotated on four coaxial bearings 72, 74, 76 and 78, spaced along its length and thermally isolated from the cylinder 28, in order to uniformly coat the substrate with the liquid 34. Preferably, the rate of rotation is around 0.5 to 2 revolutions. per second. The purpose of the revolution is to allow a small pool of liquid at the base of the mirror 28 to replenish the coating of the mirror liquid 34 and to wash the surface 32 of the mirror 28 clean every revolution.

This refreshing of the mirror 28 maintains the liquid coating on the surface 32 uniformly thick and as materially pure and optically flat as possible and ensures maintenance of the highest possible reflectivity for the mirror 28 in the EUV region required.

However it will be appreciated that the mirror liquid 34 may be periodically reformed or refreshed by several means such as new liquid flow or spray, recirculation, doctor blading, brushing, rolling or other mechanical resurfacing of the liquid.

When plasma 18 is formed from the target edge 14, some of the surface material is sputtered off or evaporated. As the material expands away from the laser focus point, it cools and can be condensed on a cooler surface.

Thus, referring to FIG. 4, the target 14 and one end of the mirror 28 are enveloped in a casing 38 with at least one opening 39 to allow the beam 12 to enter the casing 38 and strike the target edge 14 and allow for the collection and recycling of at least some of the laser ablated target material.

In the preferred embodiment, the casing 38 extends around a groove 40 turned in the cylinder 30.

In the preferred embodiment, the liquid metal bath 24 from which the surface material is drawn, is in fluid communication with the cylinder 30, in such a way that the mirror 28 can be cooled using the same liquid as the surface material for the target edge, thereby forming a cooling system to efficiently recycle the surface material as explained in more detail below.

A second casing 42 disposed around a turned groove 44 located in close proximity to the centre of the mirror 28 is provided to collect the excess mirror liquid draining from the bore hole 36.

A third casing 46 disposed around a turned groove 48 located towards the end of the mirror 28 remote from the source 18 is provided to collect and condense any laser ablated target material or mirror liquid 34 coming from the end of the mirror. An opening 49 in the casing 46 is kept to a small size, preferably around 2 mm, to block as much of the spluttered material as possible, while allowing for maximum EUV collection at the image focus.

The second and third casings, 42 and 46 respectively preferably have operating liquid levels of below 50 millilitres. Preferably, the quantity of liquid will be sufficient to maintain the thermal contact required.

Liquid may be supplied or drained from the casings 38, 42 and 46 as necessary via a drain pump.

The temperature of the system 37 is managed by controlling the temperature of the liquid collected and recycled in the casings 38, 42, and 46.

In the preferred embodiment, casing 46 is cooled across a large range of input plasma power, and preferably for power in excess of 15 kW. This is achieved by attaching a water-cooling loop, indicated as 50 and 52, to the casing 46.

The level of liquid metal 24 level in the first casing 38 is preferably kept at the minimum required to efficiently supply the surface material, preferably less than 100 millilitres. However, the quantity of liquid should also be sufficient to maintain good thermal contact between the rotating mirror cylinder 30 and the cooling system 50,52.

The second and third casings 42 and 46 respectively, require heating in order to maintain the temperature of the interior of the mirror 28 at a sufficiently high value so that the mirror liquid remains fluid. In the preferred embodiment, this is achieved by placing resistive heating elements 54, 56, and 58, 60 in thermal contact with the casings 42, 46 respectively. The liquid metal in the casings 42, 46 will maintain in efficient thermal contact between the heating elements and the body of the rotating mirror 28.

However it will be appreciated that any suitable temperature control system can be implemented.

Figure 5:
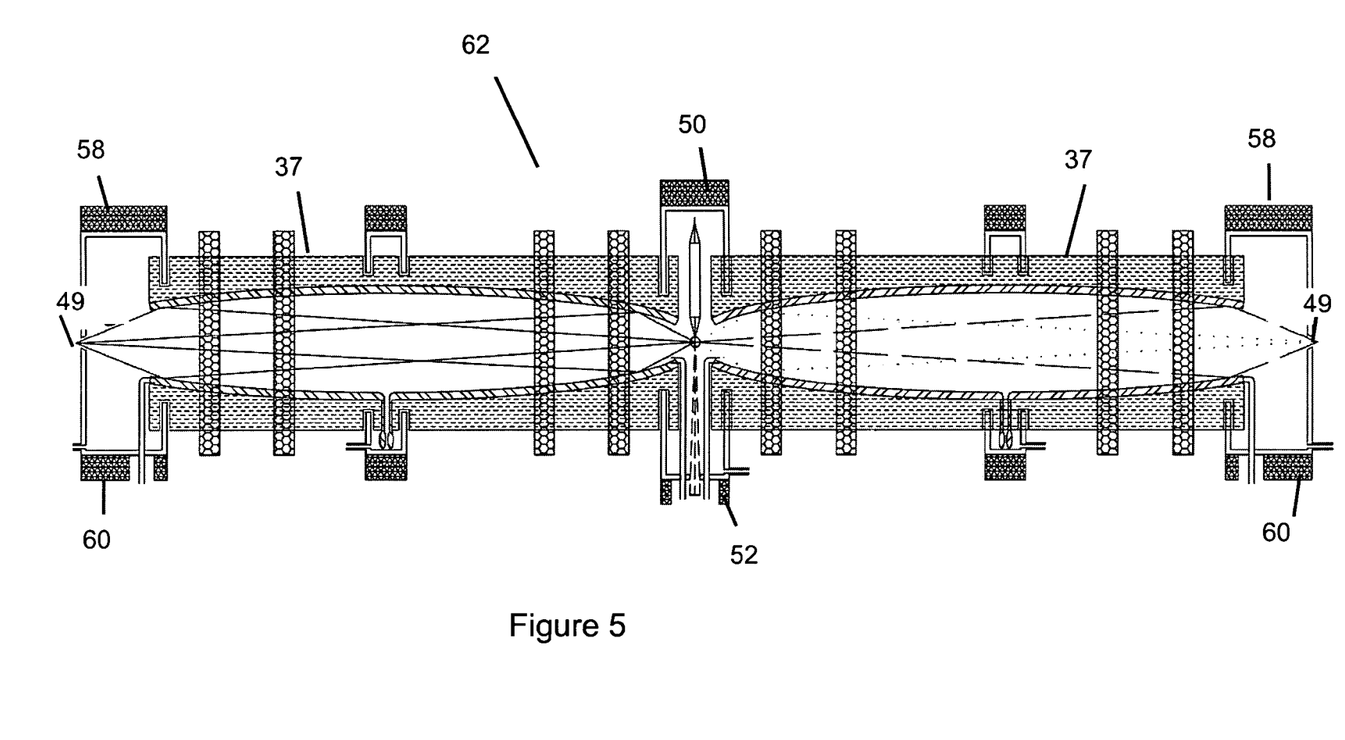
FIG. 5 shows a dual mirror system operating with the target delivery system of FIG. 1.

In a further embodiment, as illustrated in FIG. 5, there is provided a duplicate mirror system 62, positioned on the opposite side of the emitting plasma 18 from the first system 37, to harvest the EUV emitted from the other side of the plasma, thereby allowing a single EUV source to feed two separate systems, for example for use in lithography.

Figure 6:
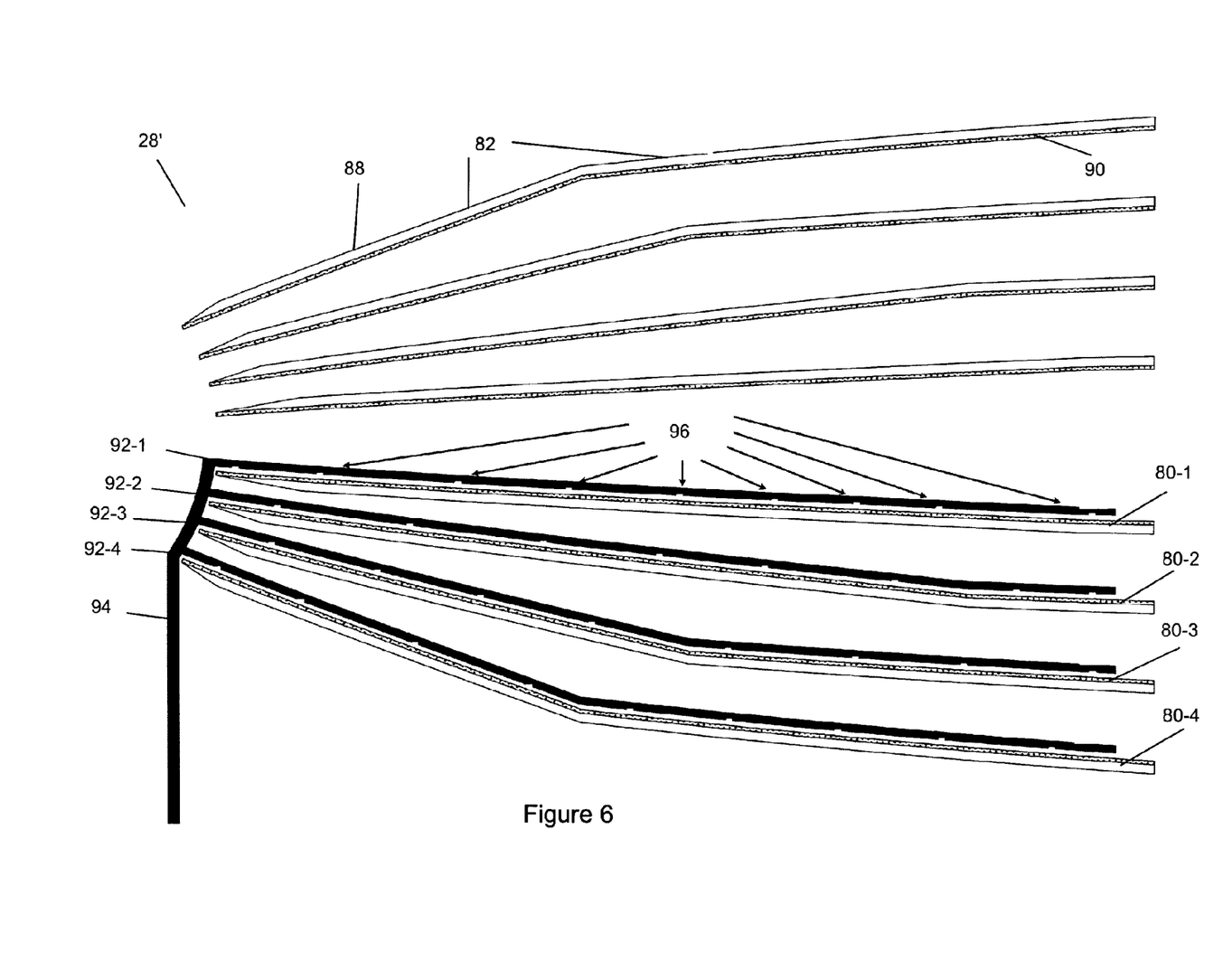
FIG. 6 shows a portion of a further embodiment of a mirror system cooperable with the target delivery system of FIG. 1.

In an alternative embodiment, the mirror system 28' comprises a known Wolter Type I structure having a plurality of concentric metal shells 80, as illustrated in FIG. 6. The mirror shells are formed from suitable aspheric sections 82 such that the beam provided from the source undergoes two grazing angle reflections to arrive at the image focus. The aspheric sections 82 of this embodiment comprise a hyperboloid first reflector portion 88 followed by an ellipsoid second reflector portion 90.

In this embodiment, the length of each of the reflectors 88 and 90 is approximately 250 mm and the focal length of the mirror 28' is of the order of 2500 mm to ensure the reflection angles are maintained as low as possible.

The mirror liquid used in this embodiment may be liquid oil or liquid metal as is used in the preferred embodiment as described above.

A liquid oil with optimal properties has a high reflectivity in the EUV and a high tolerance to the harsh conditions in proximity to the EUV producing plasma 18. The reflectivity of oils in the EUV range is largely dependent on the carbon content of the oil. Thus to obtain a high reflectivity, liquid oil with a high atomic percentage of carbon is required, such as polyphenyl ethers, and preferably, $C_{30}H_{22}O_4$.

Polyphenyl ethers are preferred as they have a high resistance to attack by UV and ions. Furthermore, polyphenyl ethers have a boiling point of almost 300° C. and the vapour pressure at 150° C. is sufficiently low for absorption of the EUV by the vapour over the length of the mirror to be kept at an acceptable level (less than 10%).

Vacuum oil reflectors have an advantage over liquid and solid metal reflectors, as they are transparent over a wide optical range and absorbing in the near ultraviolet. Furthermore, the oils have a lower reflectivity for 'out of band' radiation, which is more advantageous for imaging than the solid materials as used commonly.

The material of the mirror 28' chosen depends on the choice of mirror liquid. In the case where liquid oil is used as the mirror liquid, the preferred mirror material is a metallic material which provides optimal wetting properties. However, it will be appreciated that any material that does not react with oil and has thermal properties which allow it to remain rigid and maintain its original shape at temperatures up to about 200° C. (the upper end of the operational temperature range of oils) may be used as the mirror material.

In the case where liquid metal is used as the mirror liquid, the preferred mirror material is molybdenum. Molybdenum is the preferred choice due to its high melting point, machinability, hardness, polishability as well as its resistance to the types of liquid metals and alloys suitable for use as the mirror liquid.

The mirror 28' of the present embodiment, as illustrated in FIG. 6, comprises four shells 80-1, 80-2, 80-3, and 80-4. It will be appreciated however that any number of shells may be used. In this embodiment, the shells 80 are fabricated from rigid metal and located concentrically around their optic axis and mounted on a spoked wheel 83 disposed at the end of the mirror remote from the plasma 18, FIG. 7. The spoked mounting wheel allows for a high degree of optical transmission through the mirror 28' while giving good mechanical support.

Figure 7:
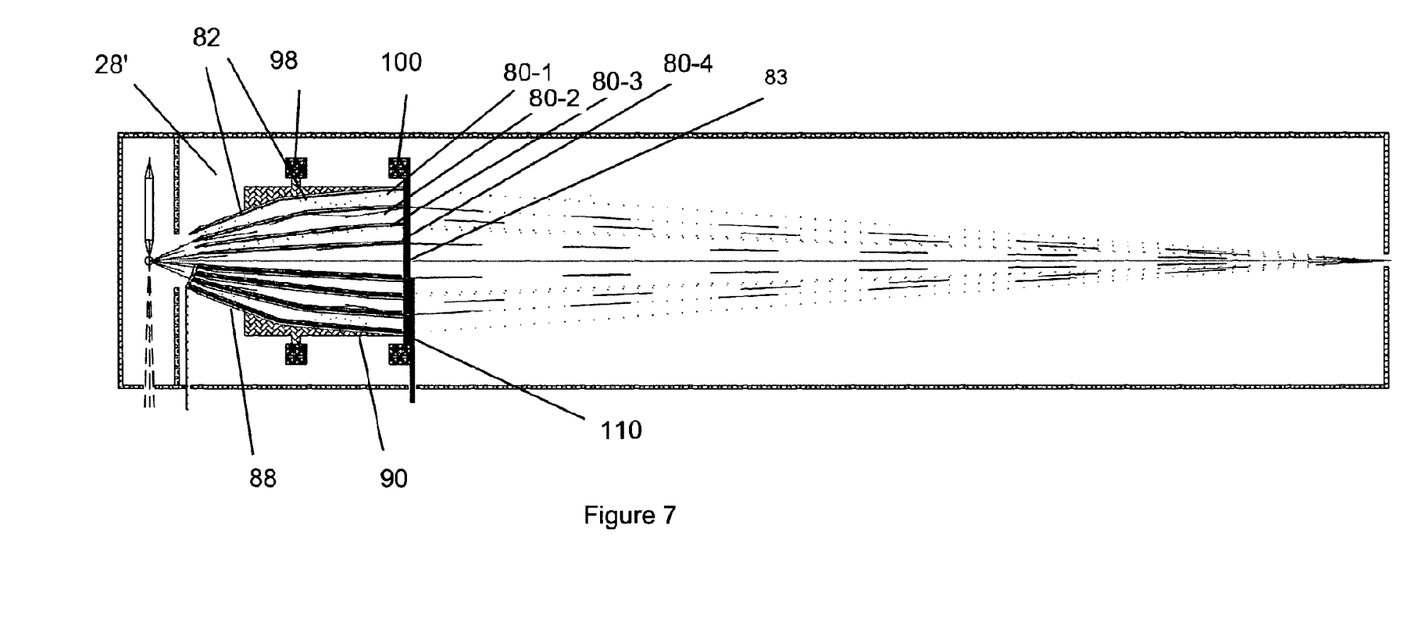

The mirror liquid. is introduced to the surface of these shells via four injection tubes 92-1, 92-2, 92-3 and 92-4, which are static and separate from the mirror sections 82. In this embodiment, the tubes 92-1, 92-2, 92-3 and 92-4, are linked together at one end 94. A plurality of holes 96 are formed along the length of the tubes 92-1, 92-2, 92-3 and 92-4, and are fed from an external source (not shown) provided at end 94. It will however be appreciated that the tubes may not be linked and may be fed separately. In this embodiment, the injection tubes have a diameter of approximately 3 mm to mitigate the amount of light from the source being obscured by the tubes.

The mirror 28' mounted on the spoked wheel is further mounted on spaced apart coaxial bearings 98 and 100 so that the mirror 28' can be rotated about its optical axis, as is illustrated in FIG. 7.

In this embodiment, the mirror 28' rotates at a rate of up to 200 rpm (approximately 3 revolutions per second). The bearings are conductively isolated from the aspheric sections 82 using a ceramic insulating material.

The revolution speed is such as to allow a small pool of liquid at the base of the mirror 28' to replenish the coating of the mirror liquid and to wash the aspheric sections 82 of the mirror 28' clean every revolution.

As the mirror is rotated, the mirror liquid coating the surfaces of the shells 80-1, 80-2, 80-3 and 80-4, is preferentially spun towards the free end of the ellipsoid second reflector 90. The mirror may also be angled so as to increase this flow rate.

A collection blade 110 is provided at the free end of the ellipsoid second reflector portion 90 to remove the excess liquid from the shells for recycling or reuse.

A cooling effect is provided by the fact that the mirror liquid 34' is being replaced periodically or constantly by fresh liquid via the tubes 92-1, 92-2, 92-3 and 92-4. The cooling rate depends on the rate of liquid flow through the mirror 28', the thermal properties of the mirror liquid and its change in temperature.

The mirror 28' of this embodiment may be used in conjunction with the target delivery system of FIG. 1 to form a similar system as described above in relation to FIG. 4. Furthermore, the mirror 28' of this embodiment may be used to form a duplicate mirror system, as described above in relation to FIG. 5.

Figure 8:
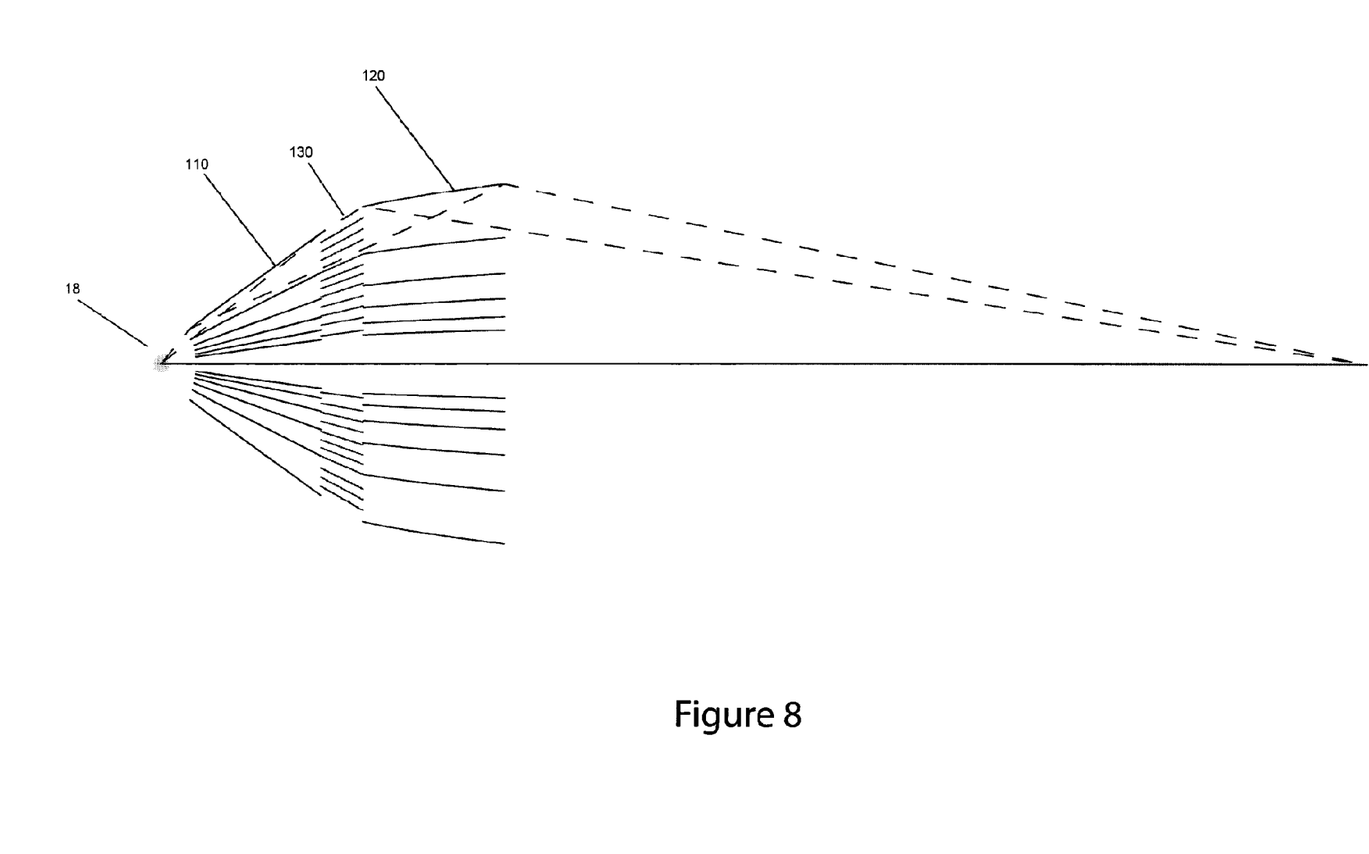
FIG. 8 shows a hybrid liquid-solid coated mirror system according to a still further aspect of the present invention.

In a variation of the above embodiments, FIG. 8, the mirror comprises a hybrid mirror system. The hybrid mirror system comprises a liquid mirror portion 110 disposed adjacent the plasma source as described in relation to the above embodiments and a solid coated mirror portion 120 disposed away from the plasma source. The portions 110 and 120 can be separated by a foil trap portion 130 which can remove much of the remaining debris from the plasma 18 or material sputtered from the liquid mirror 110. Preferably, the mirror portion 120 is coated with ruthenium. The liquid mirror portion 110 protects the delicate, but higher reflectivity, ruthenium shell 120 from line of sight to the hot plasma 18 and from proximity to this heat source. This mirror design has higher overall efficiency than a pure liquid mirror shell and may offer a compromise between mirror lifetime and efficiency.

It will be seen that the source and mirror aspects of the present invention have many applications including but not limited to a light source for lithography, a light source for a microscope, and a focussing system for a telescope or a microscope.

The invention is not limited to the embodiments described herein, which may be modified or varied without departing from the scope of the invention.

The invention claimed is:

1. A mirror for harnessing EUV radiation by reflecting EUV radiation impinging thereon, said mirror comprising a substantially aspheric surface and means for supplying an EUV reflecting liquid to at least partially coat said aspheric surface, said mirror being rotatable to confine said liquid to said aspheric surface by a combination of centrifugal force and liquid surface tension.

2. A mirror as claimed in claim 1 comprising a cylindrical body in which said aspheric surface has been formed internally, said cylinder being arranged to rotate about its longitudinal axis.

3. A mirror as claimed in claim 2 further comprising a plurality of coaxial bearings and wherein said cylinder is rotatably mounted within said bearings.

4. A mirror as claimed in claim 2 wherein said aspheric surface comprises an ellipsoidal surface arranged to focus EUV radiation incident on a first focus of the ellipsoid to a second focus of the ellipsoid.

5. A mirror as claimed in claim 4 wherein the focal length of the ellipsoid is in the range 600 mm to 1800 mm and wherein the eccentricity of the ellipsoid is in the range 0.99809 to 0.98892.

6. A mirror as claimed in claim 4 wherein said cylindrical body has an opening at one end coaxial with the major axis of said ellipsoid and adjacent said first focus said opening defining a numerical aperture less than 0.81.

7. A mirror as claimed in claim 6 wherein said means for supplying a reflecting liquid comprises a liquid source and at least one fixed tube in fluid communication with said liquid source, said cylindrical body being rotatable relative to said at least one fixed tube, at least one of said tubes being arranged to supply said liquid through said opening.

8. A mirror as claimed in claim 7 wherein said tubes are formed of molybdenum.

9. A mirror as claimed in claim 7 further comprising a liquid sink and wherein said cylindrical body includes a sink hole located at a widest part of said aspheric surface providing fluid communication from said surface to a liquid sink.

10. A mirror as claimed in claim 9 wherein said liquid sink and said liquid source are in fluid communication to recycle liquid through said mirror.

11. A mirror as claimed in claim 9 further comprising a peripheral casing within which said sink hole rotates, said casing being arranged to receive liquid from said sink hole and to supply said liquid to said liquid sink.

12. A mirror as claimed in claim 11 further comprising a heater for said peripheral casing.

13. A mirror as claimed in claim 6, wherein said means for supplying a reflecting liquid includes at least one supply hole formed in said cylindrical body and providing fluid communication between a liquid source and said aspheric surface.

14. A mirror as claimed in claim 6 comprising a first portion adjacent said opening which is coated with said liquid and a second portion remote from said opening which is coated with a solid reflective coating.

15. A mirror as claimed in claim 14 wherein said solid reflective coating comprises ruthenium.

16. A mirror as claimed in claim 2 wherein said cylindrical body is 986 mm in length and wherein said means for supplying a reflecting liquid is arranged to supply sufficient liquid to coat said aspheric surface to a depth of 100 microns.

17. A mirror as claimed in claim 1 wherein said mirror surface is composed of molybdenum.

18. A mirror as claimed in claim 1 wherein said liquid is one of a eutectic alloy, AU80DN20, Field's metal, Galinstan, a polyphenyl ether, or $C_{30}H_{22}O_4$.

19. A mirror as claimed in claim 1 comprising a plurality of concentric metal shells each having an aspheric surface and wherein said means for supplying a reflecting liquid is arranged to supply liquid to at least partially coat each said aspheric surface.

20. A mirror as claimed in claim 19 further comprising a liquid source and wherein said mirror has an opening at one end adjacent a focus of said aspheric surfaces and wherein said means for supplying a reflecting liquid comprises a plurality of fixed tubes each in fluid communication with said liquid source for supplying said liquid through said opening to a respective aspheric surface, said mirror being rotatable relative to said fixed tubes.

21. A mirror as claimed in claim 20 further comprising a liquid sink wherein said mirror has a second opening remote from said first opening and further comprising a fixed collection blade arranged to engage each shell at said second opening for collecting liquid from each shell, said mirror being rotatable relative to said collection blade and said blade being in fluid communication with said liquid sink.

22. A mirror as claimed in claim 20 wherein said mirror shells comprise aspheric sections arranged to cause EUV radiation from a plasma source adjacent said opening to undergo two grazing angle reflections to arrive at a focus.

23. A mirror as claimed in claim 22 wherein said aspheric sections each comprise a hyperboloid first reflector portion adjacent said opening and an ellipsoid second reflector portion remote from said opening.

24. A mirror as claimed in claim 23 having a length of 250 mm and a focal length of approximately 2500 mm.

25. A system for providing extreme ultraviolet (EUV) radiation comprising:
a laser source arranged to produce a laser beam having a focus;
a carrier movable relative to said laser source for carrying a surface material, the surface material when carried by said carrier providing a renewable target edge, said focussed beam being arranged to impinge on said target edge to produce an EUV radiation emitting plasma; and
the mirror of claim 1.

26. A system for providing extreme ultraviolet (EUV) radiation comprising:
a laser source arranged to produce a laser beam having a focus;
a carrier movable relative to said laser source for carrying a surface material, the surface material when carried by said carrier providing a renewable target edge, said focussed beam being arranged to impinge on said target edge to produce an EUV radiation emitting plasma; and two mirrors according to claim 1, said mirrors being disposed diametrically opposite one another on either side of target edge.

27. A system as claimed in claim 26 further comprising a casing enclosing said target edge and an adjacent end of said mirror, said casing having an opening to allow light from said laser source to enter the casing and strike the target edge and to provide a sink for the collection and recycling of target edge material ablated by said laser.

28. A system for providing extreme ultraviolet (EUV) radiation comprising:

a laser source arranged to produce a laser beam having a focus; and a carrier movable relative to said laser source for carrying a surface material, the surface material when carried by said carrier providing a renewable target edge, said focussed beam being arranged to impinge on said target edge to produce an EUV radiation emitting plasma.

29. A system as claimed in claim 28 wherein said laser source is arranged to focus said beam on a region of said target edge.

30. A system as claimed in claim 28 where said laser source has a wavelength of 1064 nm and said laser source is arranged to emit 15 ns pulses with a power density of $1.6 \times 10^{11}$ Watts/cm$^2$.

31. A system as claimed in claim 28 comprising a liquid metal source and wherein said carrier comprises a roller, a segment of which is in use immersed in said liquid metal source to coat said segment of said roller with said liquid metal, said liquid solidifying after emerging from said liquid metal source to provide said target edge.

32. A system as claimed in claim 31 wherein said liquid metal source comprises a bath containing said liquid metal.

33. A system as claimed in claim 32 further comprising means for maintaining said metal in said bath in a liquid state said maintaining means comprises means for cooling said bath when said laser source is in operation.

34. A system as claimed in claim 31 comprising means disposed between where said roller emerges from said liquid metal and before said focussed beam impinges on said target edge for engaging and shaping said coating to provide said target edge.

35. A system as claimed in claim 34 wherein said carrier includes a blade formed around the periphery of said roller, said blade being arranged to contact and to pick up liquid metal as a coating on said blade and wherein said shaping means comprises a doctoring blade for forming said target edge around the periphery of said roller.

36. A system as claimed in claim 35 wherein said blade is formed of molybdenum.

37. A system as claimed in claim 35 wherein said blade has a triangular section with a base formed on said roller and extending to an apex disposed away from said roller, said doctoring blade being arranged to form said target edge on said apex.

38. A system as claimed in claim 35 wherein said blade has a square section, said doctoring blade being arranged to form said target edge on the corners of said square section disposed away from said roller.

39. A system as claimed in claim 35 wherein said shaping means comprises a counter rotating roller having a profile defined around its periphery, said profile being arranged to form said target edge from said coating around the periphery of said roller.

* * * * *